(12) United States Patent  
Tian

(10) Patent No.: US 12,004,409 B2  
(45) Date of Patent: Jun. 4, 2024

(54) DISPLAY PANEL AND DISPLAY DEVICE

(71) Applicant: HONOR DEVICE CO., LTD., Guangdong (CN)

(72) Inventor: Zheng Tian, Guangdong (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/256,265

(22) PCT Filed: Feb. 18, 2022

(86) PCT No.: PCT/CN2022/076948  
§ 371 (c)(1),  
(2) Date: Jun. 7, 2023

(87) PCT Pub. No.: WO2022/227809  
PCT Pub. Date: Nov. 3, 2022

(65) Prior Publication Data  
US 2024/0032386 A1  Jan. 25, 2024

(30) Foreign Application Priority Data

Apr. 30, 2021  (CN) .......................... 202110486533.5  
May 27, 2021  (CN) .......................... 202110587490.X

(51) Int. Cl.  
*H10K 59/82* (2023.01)  
*G09G 3/3233* (2016.01)

(52) U.S. Cl.  
CPC ........... *H10K 59/82* (2023.02); *G09G 3/3233* (2013.01); *G09G 2300/0842* (2013.01)

(58) Field of Classification Search  
CPC ................. H10K 59/82; G09G 3/3233; G09G 2300/0842  
See application file for complete search history.

(56) References Cited

U.S. PATENT DOCUMENTS

| | | | |
|---|---|---|---|
| 9,261,750 | B2 | 2/2016 | Li et al. |
| 9,646,559 | B2 | 5/2017 | Min et al. |
| 9,811,169 | B2 | 11/2017 | Song et al. |
| 10,373,986 | B2 | 8/2019 | Lai et al. |
| 10,468,475 | B2 | 11/2019 | Cai et al. |
| 11,069,302 | B2 | 7/2021 | Lee et al. |

(Continued)

FOREIGN PATENT DOCUMENTS

| | | |
|---|---|---|
| CN | 103217843 A | 7/2013 |
| CN | 103578443 A | 2/2014 |

(Continued)

*Primary Examiner* — Lixi C Simpson

(57) ABSTRACT

A display panel includes a display area (DA) and a peripheral area (PA) surrounding the display area (DA). The display area (DA) includes a second area and a first area that includes first pixel units disposed around holes, where the second area includes second pixel units and K data lines. The second pixel units include M columns*N rows of light emitting devices, M*N bottom drive circuits located at lower layers of the light emitting devices, and M*N anode leads connecting the light emitting devices to the bottom drive circuits. Intervals between some or all of the adjacent light emitting devices are greater than dimensions of the bottom drive circuits corresponding to the light emitting devices, and therefore there are gaps between the some or all of the second pixel units.

13 Claims, 9 Drawing Sheets

(56) References Cited

U.S. PATENT DOCUMENTS

| | | |
|---|---|---|
| 11,723,238 B2 | 8/2023 | Kim et al. |
| 11,737,325 B2 | 8/2023 | Yang et al. |
| 2018/0103183 A1 | 4/2018 | Liu et al. |
| 2019/0259345 A1 | 8/2019 | Kohei et al. |
| 2020/0064702 A1* | 2/2020 | Yeh .................. G02F 1/136286 |
| 2020/0202784 A1 | 6/2020 | Kim et al. |
| 2020/0411625 A1 | 12/2020 | Seo et al. |
| 2021/0296424 A1 | 9/2021 | Cho et al. |
| 2021/0296425 A1 | 9/2021 | Ochi et al. |
| 2022/0123094 A1 | 4/2022 | Qiu et al. |
| 2022/0208060 A1* | 6/2022 | Kim ....................... G09G 3/20 |
| 2022/0415250 A1 | 12/2022 | Choi et al. |
| 2023/0060341 A1* | 3/2023 | Du ...................... H10K 59/121 |

FOREIGN PATENT DOCUMENTS

| | | |
|---|---|---|
| CN | 104464533 A | 3/2015 |
| CN | 104952883 A | 9/2015 |
| CN | 107293570 A | 10/2017 |
| CN | 107393458 A | 11/2017 |
| CN | 107561799 A | 1/2018 |
| CN | 207425860 U | 5/2018 |
| CN | 108447887 A | 8/2018 |
| CN | 108957881 A | 12/2018 |
| CN | 108962037 A | 12/2018 |
| CN | 109064907 A | 12/2018 |
| CN | 109713024 A | 5/2019 |
| CN | 109754744 A | 5/2019 |
| CN | 109981855 A | 7/2019 |
| CN | 110164388 A | 8/2019 |
| CN | 111326560 A | 6/2020 |
| CN | 111584552 A | 8/2020 |
| CN | 111916486 A | 11/2020 |
| CN | 111951687 A | 11/2020 |
| CN | 112054038 A | 12/2020 |
| CN | 112133197 A | 12/2020 |
| CN | 112242424 A | 1/2021 |
| CN | 112567528 A | 3/2021 |
| CN | 112614876 A | 4/2021 |
| CN | 112669750 A | 4/2021 |
| CN | 113900307 A | 1/2022 |
| CN | 114041182 A | 2/2022 |
| JP | 2010153183 A | 7/2010 |
| WO | 2020079805 A1 | 4/2020 |
| WO | 2021045954 A1 | 3/2021 |

\* cited by examiner

DISPLAY PANEL AND DISPLAY DEVICE

This application is a national stage of International Application No. PCT/CN2022/076948, filed on Feb. 18, 2022, which claims priority to Chinese Patent Application No. 202110486533.5, filed on Apr. 30, 2021, and Chinese Patent Application No. 202110587490.X, filed on May 27, 2021. The disclosures of each of the aforementioned applications are hereby incorporated by reference in their entireties.

TECHNICAL FIELD

This application relates to the field of terminal technologies, and in particular, to a display panel and a terminal device.

BACKGROUND

To improve visual experience, terminals such as a smartphone develop towards a full screen. The development of the full screen drives a sensor of a camera originally occupying a display to be hidden at the bottom of the screen. To ensure a shooting effect, a display panel corresponding to the camera needs to be drilled to expose the camera, and the display panel corresponding to the sensor of the camera needs to have specific transmittance to ensure a display effect.

However, when pixel units around the camera are connected by using a data line, the data line passes through an under display camera (under display camera, UDC) area.

In this way, the data line may reduce transmittance of the UDC area, and then reduce a shooting effect of the camera.

SUMMARY

Embodiments of this application provide a display panel and a display device. Bottom drive circuits in pixel units are reduced, and therefore areas of the bottom drive circuits are less than areas of light emitting devices driven by the bottom drive circuits. There are gaps between the pixel units, and data lines pass through space (gaps) reserved after the drive circuits are compressed. In this way, the data lines avoid a UDC area, to improve transmittance of the UDC area, and improve a shooting effect of a camera.

According to a first aspect, an embodiment of this application provides a display panel, applied to a terminal device. The display panel includes a display area and a peripheral area at least partially surrounding the display area, where the display area includes a second area and a first area that is disposed around a hole. The first area includes a plurality of first pixel units arranged in columns, and the second area includes a plurality of second pixel units and K data lines arranged between the second pixel units in the second area, where K is a natural number. The plurality of first pixel units in the first area are connected in a column direction to corresponding columns of second pixel units in the second area. Some or all of the second pixel units include M columns*N rows of light emitting devices, M columns*N rows of bottom drive circuits, and M*N anode leads, where the anode leads are used to connect the light emitting devices to the bottom drive circuits, the bottom drive circuits are disposed at lower layers of the light emitting devices, and both M and N are natural numbers. Intervals between the adjacent light emitting devices in a row direction in the some or all of the second pixel units are greater than dimensions between the bottom drive circuits corresponding to the adjacent light emitting devices in the row direction, and therefore there are gaps between the some or all of the second pixel units. The K data lines are used to pass through gaps between the plurality of second pixel units in the second area, to connect Q columns of second pixel units in the second area, where the Q columns of second pixel units include a plurality of columns of second pixel units whose holes correspond to the second area in the column direction, and Q is a natural number less than or equal to K.

In this way, the bottom drive circuits are compressed, and therefore there are gaps between the second pixel units. In addition, when the pixel units corresponding to the holes in the column direction are connected, the data lines pass through the gaps between the second pixel units in the second area without occupying space of the second area, so that transmittance of the second area is improved.

Optionally, the hole is configured to dispose a lens of the camera, and the first area is used to dispose a sensor of the camera, where the first area is a UDC area. In this way, transmittance of the UDC area is improved, and a shooting effect of the camera is improved.

Optionally, the light emitting device includes a light emitting area and a process redundancy area, and the interval is a distance between geometric centers of light emitting areas in the adjacent light emitting devices in the row direction.

Optionally, any one of the data lines includes a first part connection line, a second part connection line, and a third part connection line, and the first part connection line, the second part connection line, and the third part connection line communicate with each other. Connection points formed between the first part connection line and any column of the light emitting devices are located on a first side of the hole, and connection points formed between the third part connection line and any column of the light emitting devices are located on a second side of the hole, where the first side is opposite to the second side. The first part connection line extends in the row direction and passes through gaps between the second pixel units in the second area to connect the second part connection line, the second part connection line extends in the column direction and passes through gaps between the second pixel unit in the second area to connect the third part connection line, and the third part connection line extends in the row direction and passes through gaps between the second pixel units in the second area.

In this way, the data lines may be arranged in a plurality of manners, and pass through gaps between the second pixel units in the second area without occupying space of the first area, so that transmittance of the first area is improved.

Optionally, a straight line in which the first part connection line is located and a straight line in which the second part connection line is located are connected at an included angle of 90 degrees, and the straight line in which the second part connection line is located and a straight line in which the third part connection line is located are connected at an included angle of 90 degrees.

Optionally, N is a multiple of 2, and K is equal to Q*M. The Q columns of second pixel units are connected by using the K data lines, and the second pixel units of the L columns to the Q column other than the Q columns of second pixel units in the L columns of second pixel units extend and are connected in the column direction.

In this way, the second pixel units corresponding to the holes in the column direction are connected by using the data lines passing through the gaps between the second pixel units, and the remaining second pixel units in the second area extend and are connected in the column direction.

Optionally, any one of the data lines passes through the gaps between the plurality of second pixel units in the second area in a Z shape, a Ω shape, a zigzag shape, or a curved shape.

Optionally, bottom drive circuits of the first pixel units in the first area are disposed in the peripheral area, light emitting devices of the first pixel units in the first area are disposed in the first area, and the light emitting devices of the first pixel units and the bottom drive circuits of the first pixel units are connected by using anode leads of transparent materials.

In this way, the first area includes no bottom drive circuit, and the anode leads are made of transparent materials, so that transmittance of the first area is further improved.

Optionally, the Q columns of second pixel units further includes a plurality of columns of second pixel units that are in the first area and that correspond to the second area in the column direction.

In this way, the data lines of the plurality of columns of the second pixel units corresponding to the first area in the column direction pass through the gaps between the second pixel units without occupying space of the second area, so that transmittance of the second area is further improved.

Optionally, bottom drive circuits of the first pixel units in the first area are disposed in some of the second pixel units in the first area, light emitting devices of the first pixel units in the first area are disposed in the first area, and the light emitting devices of the first pixel units and the bottom drive circuits of the first pixel units are connected by using anode leads of transparent materials.

In this way, the first area includes no bottom drive circuit, and the anode leads are made of transparent materials, so that transmittance of the first area is further improved.

Optionally, a width of the peripheral area is narrowed at a corner corresponding to the display area.

According to a second aspect, an embodiment of this application provides a display panel, applied to a terminal device. The display panel includes a display area and a peripheral area at least partially surrounding the display area, where the display area includes a second area and a first area that is disposed around a hole. The first area includes a plurality of first pixel units arranged in columns, and the second area includes a plurality of second pixel units and K data lines arranged between the second pixel units in the second area, where K is a natural number. The plurality of first pixel units in the first area are connected in a column direction to corresponding columns of second pixel units in the second area. Some or all of the second pixel units include M columns*N rows of light emitting devices, M columns*N rows of bottom drive circuits, and M*N anode leads, where the anode leads are used to connect the light emitting devices to the bottom drive circuits, the bottom drive circuits are disposed at lower layers of the light emitting devices, and both M and N are natural numbers. A dimension of an area enclosed by the light emitting devices in the some or all of the second pixel units is greater than a dimension of an area enclosed by the bottom drive circuits corresponding to the light emitting devices in the pixel units, and therefore there are gaps between the some or all of the second pixel units. The K data lines are used to pass through gaps between the plurality of second pixel units in the second area, to connect Q columns of second pixel units in the second area, where the Q columns of second pixel units are a plurality of columns of second pixel units whose holes correspond to the second area in the column direction, and Q is a natural number less than or equal to K.

In this way, the bottom drive circuits are compressed, and therefore there are gaps between the second pixel units. In addition, when the pixel units corresponding to the holes in the column direction are connected, the data lines pass through the gaps between the second pixel units in the second area without occupying space of the second area, so that transmittance of the second area is improved.

Optionally, the hole is configured to dispose a lens of the camera, and the first area is used to dispose a sensor of the camera, where the first area is a UDC area. In this way, transmittance of the UDC area is improved, and a shooting effect of the camera is improved.

Optionally, the light emitting device includes a light emitting area and a process redundancy area.

Optionally, any one of the data lines includes a first part connection line, a second part connection line, and a third part connection line, and the first part connection line, the second part connection line, and the third part connection line communicate with each other. Connection points formed between the first part connection line and any column of the light emitting devices are located on a first side of the hole, and connection points formed between the third part connection line and any column of the light emitting devices are located on a second side of the hole, where the first side is opposite to the second side. The first part connection line extends in the row direction and passes through gaps between the second pixel units in the second area to connect the second part connection line, the second part connection line extends in the column direction and passes through gaps between the second pixel unit in the second area to connect the third part connection line, and the third part connection line extends in the row direction and passes through gaps between the second pixel units in the second area.

In this way, the data lines may be arranged in a plurality of manners, and pass through gaps between the second pixel units in the second area without occupying space of the first area, so that transmittance of the first area is improved.

Optionally, a straight line in which the first part connection line is located and a straight line in which the second part connection line is located are connected at an included angle of 90 degrees, and the straight line in which the second part connection line is located and a straight line in which the third part connection line is located are connected at an included angle of 90 degrees.

Optionally, N is a multiple of 2, and K is equal to Q*M. The Q columns of second pixel units are connected by using the K data lines, and the second pixel units of the L columns to the Q column other than the Q columns of second pixel units in the L columns of second pixel units extend and are connected in the column direction.

In this way, the second pixel units corresponding to the holes in the column direction are connected by using the data lines passing through the gaps between the second pixel units, and the remaining second pixel units in the second area extend and are connected in the column direction.

Optionally, any one of the data lines passes through the gaps between the plurality of second pixel units in the second area in a Z shape, a Ω shape, a zigzag shape, or a curved shape.

Optionally, bottom drive circuits of the first pixel units in the first area are disposed in the peripheral area, light emitting devices of the first pixel units in the first area are disposed in the first area, and the light emitting devices of the first pixel units and the bottom drive circuits of the first pixel units are connected by using anode leads of transparent materials.

In this way, the first area includes no bottom drive circuit, and the anode leads are made of transparent materials, so that transmittance of the first area is further improved.

Optionally, the Q columns of second pixel units further includes a plurality of columns of second pixel units that are in the first area and that correspond to the second area in the column direction. In this way, the data lines of the plurality of columns of the second pixel units corresponding to the first area in the column direction pass through the gaps between the second pixel units without occupying space of the second area, so that transmittance of the second area is further improved.

Optionally, bottom drive circuits of the first pixel units in the first area are disposed in some of the second pixel units in the first area, light emitting devices of the first pixel units in the first area are disposed in the first area, and the light emitting devices of the first pixel units and the bottom drive circuits of the first pixel units are connected by using anode leads of transparent materials.

In this way, the first area includes no bottom drive circuit, and the anode leads are made of transparent materials, so that transmittance of the first area is further improved.

Optionally, a width of the peripheral area is narrowed at a corner corresponding to the display area.

According to a third aspect, an embodiment of this application provides a display, including the display panel according to the first aspect or the second aspect, where the display panel is configured to display an image.

For beneficial effects brought by the display provided in the third aspect and the possible designs of the third aspect, refer to beneficial effects brought by the display panel provided in the first aspect and the possible designs of the first aspect. Details are not described herein again.

According to a fourth aspect, an embodiment of this application provides a display device, including the display according to the third aspect. The display is configured to display an image.

For beneficial effects brought by the display device provided in the fourth aspect and the possible designs of the fourth aspect, refer to beneficial effects brought by the display panel provided in the first aspect and the possible designs of the first aspect. Details are not described herein again.

DESCRIPTION OF EMBODIMENTS

Figure 1:
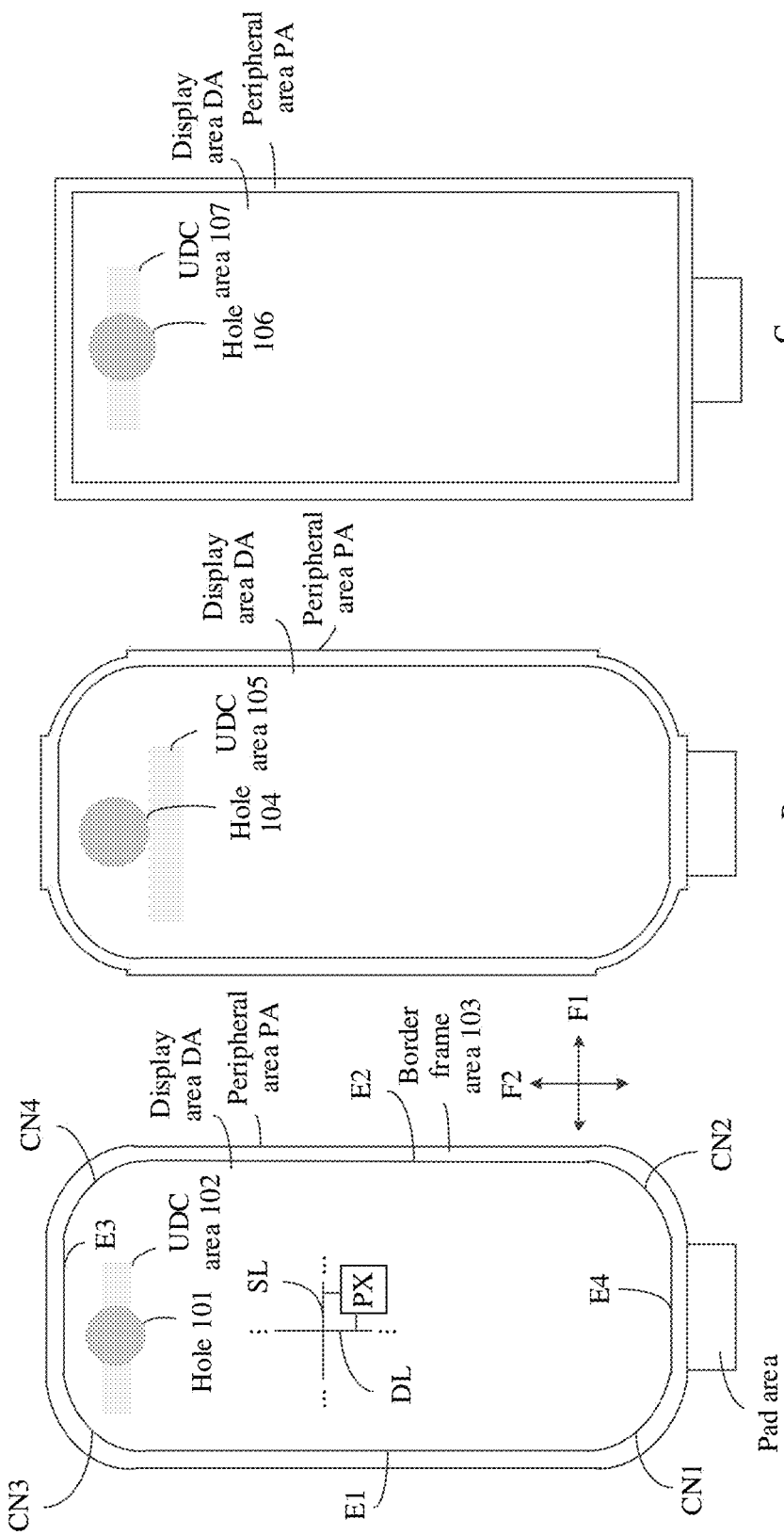
FIG. 1 is a schematic diagram of a structure of a display panel according to a possible implementation.

To clearly describe technical solutions in embodiments of this application, in embodiments of this application, words such as "first" and "second" are used to distinguish between same items or similar items with basically the same functions and effects. For example, a first device and a second device are merely used to distinguish between different devices, and are not intended to limit a sequence thereof. A person skilled in the art may understand that words such as "first" and "second" do not limit a quantity or an execution order, and the words such as "first" and "second" do not necessarily indicate a difference.

It should be noted that, in this application, the terms "example" or "for example" is used to represent giving an example, an illustration, or a description. Any embodiment or design solution described as an "example" or "for example" in this application should not be explained as being more preferred or having more advantages than other embodiments or design solutions. To be precise, the use of the words such as "example" or "for example" is intended to present a related concept in a specific manner.

It should be noted that, in embodiments of this application, the terms "example" or "for example" is used to represent giving an example, an illustration, or a description. Any embodiment or design solution described as an "example" or "for example" in embodiments of this application should not be explained as being more preferred or having more advantages than other embodiments or design solutions. To be precise, the use of the words such as "example" or "for example" is intended to present a related concept in a specific manner.

It should be noted that, in embodiments of this application, "include" and/or "contain" specify/specifies existence of stated features or elements, but do/does not exclude existence or addition of one or more other features or elements. On the contrary, "consist of" specifies existence of stated features or elements and excludes existence of other features or elements.

Further, when a layer, an area, or an element is referred to as "being" located "on" another layer, another area, or another element, it indicates that the layer, the area, or the element is directly or indirectly located on the another layer, the another area, or the another element. For example, there may be an intermediate layer, an intermediate area, or an intermediate element.

For ease of description, a dimension of an element in the accompanying drawings may be exaggerated or reduced. Therefore, although a relative dimension and angle of the element shown in the accompanying drawings may indicate at least one example embodiment of this disclosure, there may be other example embodiments of this disclosure having a relative dimension and angle different from the shown relative dimension and angle.

When a wiring is referred to as "extending in a first direction or a second direction", it indicates that the wiring may extend not only in a linear shape, but also in a zigzag or curved shape in the first direction or the second direction. In addition, when it is said that a wiring or an element extends in a specific direction, it indicates that the wiring or the element extends mainly in the specific direction. For example, the wiring or the element extends farther in the specific direction than in any other direction.

In embodiments of this application, "in a plan view" means a diagram of a target part viewed from above, and "in a cross-sectional view" means a vertical cross-sectional view of the target part viewed from a side. Unless otherwise defined, the term "overlap" includes overlapping "in a plan view" and "in a cross-sectional view". Unless otherwise defined, the signals described in this specification are generic terms for voltage or current.

A camera is an important part of a terminal such as a smartphone. The camera may be briefly divided into a lens and a sensor. The lens is configured to perform shooting and imaging, and the sensor is configured to receive an optical signal passing through the lens and convert the optical signal into an electrical signal for display. To improve visual experience, terminals such as a smartphone develop towards a full screen. The development of the full screen drives a sensor of a camera originally occupying a display to be hidden at the bottom of the screen. To ensure a shooting effect and a display effect, a panel corresponding to the lens of the camera needs to be drilled, and a panel corresponding to the sensor of the camera needs to have specific transmittance. The panel corresponding to the sensor of the camera may be referred to as a under display camera (under display camera, UDC) area. The UDC area further includes other sensors (for example, an infrared sensor).

To facilitate understanding of the display panel provided in embodiments of this application, the display panel may be used in a display of a display device, and the display may be a flexible display or a rigid display. The flexible display may be an OLED flexible display, or a quantum dot light emitting diode (quantum dot light emitting diode, QLED) flexible display. The display device may be a common mobile terminal such as a mobile phone, a tablet computer. Certainly, the display device may alternatively be another existing known mobile terminal.

For example, FIG. 1 is a schematic plan view of two types of display panels according to an embodiment of this application. A display panel shown in A in FIG. 1 includes a display area DA and a peripheral area PA. The peripheral area PA is located outside the display area DA, and at least partially surrounds the display area DA.

The display area DA is used to display an image. As shown in FIG. 1, the display area DA may include a first edge E1 and a second edge E2 facing each other and a third edge E3 and a fourth edge E4 that are located between the first edge E1 and the second edge E2 and that face each other. The first edge E1 and the fourth edge E4 may be connected by using a first corner CN1 having a circular shape, and the second edge E2 and the fourth edge E4 may be connected by using a second corner CN2 having a circular shape. The first edge E1 and the third edge E3 may be connected by using a third corner CN3 having a circular shape, and the second edge E2 and the third edge E3 may be connected by using a fourth corner CN4 having a circular shape.

All the first corner CN1, the second corner CN2, the third corner CN3, and the fourth corner CN4 that have circular shapes may be referred to as R corners.

The display area DA further includes a hole 101 and a UDC area 102. The hole 101 is located right above the lens of the camera. The UDC area 102 is located right above the sensor of the camera. The UDC area 102 is disposed around the hole 101.

It should be noted that there are various shapes of the UDC area. For example, the UDC area is rectangular, triangular, circular, or the like. This not limited herein. The UDC area is disposed around the hole. A specific location of the UDC area is not limited in embodiments of this application.

The display area DA includes a plurality of pixel units PX and wirings that can apply an electrical signal to the plurality of pixel units PX.

Each pixel unit PX may include a light emitting device and a bottom drive circuit configured to drive the light emitting device. For example, the light emitting device may be an organic light emitting diode, and the bottom drive circuit may include a plurality of transistors, capacitors, and the like.

The wirings that can apply an electrical signal to the plurality of pixel units PX may include a plurality of scanning lines SL, a plurality of data lines DL, and the like. Each of the plurality of scanning lines SL may extend in a first direction F1, and each of the plurality of data lines DL may extend in a second direction F2. The scanning line SL is used to transmit a scanning signal to a pixel PX, and the data line DL is used to transmit a data signal to a pixel unit PX. Each of the plurality of pixel units PX may be connected to a corresponding scanning line SL among the plurality of scanning lines SL and a corresponding data line DL among the plurality of data lines DL.

The peripheral area PA may at least partially surrounds the display area DA. The peripheral area PA in which a pixel unit PX is not disposed may be simply divided into a border frame area 103 adjacent to the display area DA and a pad area PADA.

For ease of description, in embodiments of this application, the border frame area 103 includes, but is not limited to, a GOA area, a VSS signal area, a protection and detection area, or a DAM area.

The GOA area is used to drive a pixel unit PX to display an image. The GOA area includes a GOA circuit. The GOA circuit may include a scan driver SDV, an emit driver EDV, and/or the like. The scan driver SDV is configured to supply one or more electrical signals, such as a scanning signal, to a plurality of pixel units PX along a signal line such as the scanning line SL. The emit driver EDV is configured to supply one or more electrical signals, such as an emitting control signal, to the pixel units PX along a signal line such as an emitting control line.

The VSS signal area is used to output a cathode signal for the display area DA. Specifically, a circuit of the VSS signal area is connected to a cathode of a pixel unit PX, to provide the cathode signal to the pixel unit PX.

The protection and detection area is used to protect and detect the panel. The protection and detection area includes, but is not limited to, a panel crack detect (panel crack detect, PCD) circuit and an isolation column. The isolation column is used to isolate water, oxygen, and the like in the air, to avoid water absorption of an organic material in the display panel.

The DAM area includes a DAM packaging unit. The packaging unit is configured to isolate water, oxygen, and the like in the air, to avoid water absorption of an organic material in the display panel.

The pad area PADA is an area in which various electronic devices, printed circuit boards, or the like are electrically attached. A plurality of pads in the pad area PADA may be electrically connected to a data driver. The display area DA is used to display an image.

A display panel shown in B in FIG. 1 also includes a display area DA and a peripheral area PA. The peripheral area PA is located outside the display area DA, and at least partially surrounds the display area DA. A difference from A in FIG. 1 is that border frames of corners of the display area DA shown in B in FIG. 1 are narrower. The display area DA shown in B in FIG. 1 includes a hole 104 and a UDC area 105. The hole 104 is located directly over the lens of the camera, and the UDC area 105 is located directly over the sensor of the camera. The UDC area 105 surrounds the hole 104.

A display panel shown in C in FIG. 1 also includes a display area DA and a peripheral area PA. The peripheral area PA is located outside the display area DA, and at least partially surrounds the display area DA. A difference from the display panel shown in A in FIG. 1 is that, in the display panel shown in C in FIG. 1, edge lines of the display area DA are connected in a straight line, and corners of the display area DA are right angles.

The display area DA shown in C in FIG. 1 includes a hole 106 and a UDC area 107. The hole 106 is located right above the lens of the camera, and the UDC area 107 is located right above the sensor of the camera.

For ease of understanding, a structure and an operating principle of the sensor of the camera in the display panel is described below with reference to FIG. 2. For example, the camera may perform shooting by using a time of flight (time of flight, TOF) technology.

Figure 2:
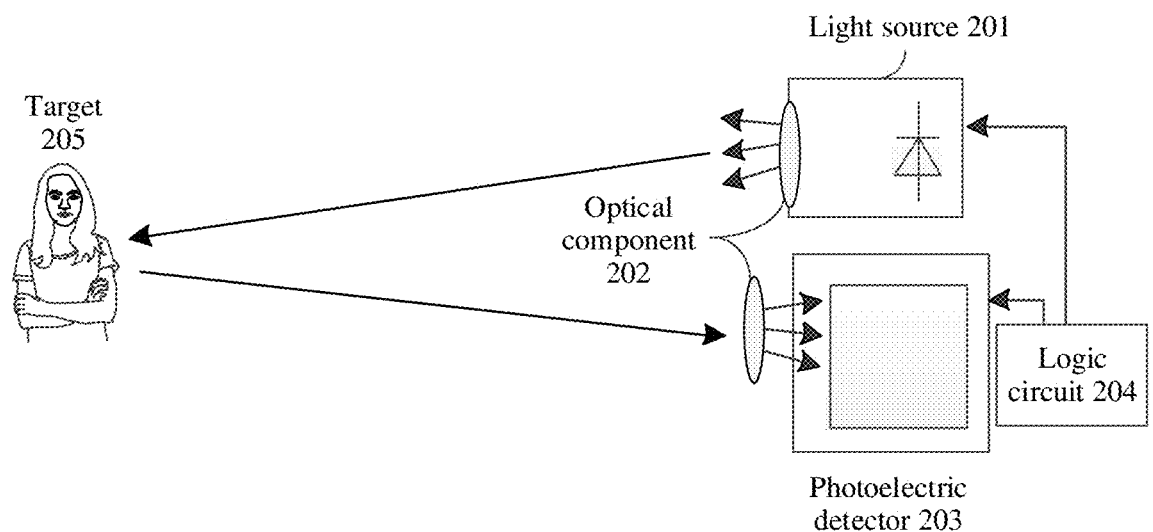
FIG. 2 is a schematic diagram of an operating principle of a camera according to a possible implementation.

FIG. 2 is a schematic diagram of a scenario of a TOF camera according to an embodiment of this application. As shown in FIG. 2, the TOF camera includes a light source 201, an optical component 202, a photoelectric detector 203, and a logic circuit 204.

The light source 201 is used to emit a light pulse.

The optical component 202 is configured to transmit the light pulse and an optical signal reflected by an external object.

The photoelectric detector 203 is configured to receive the light pulse reflected by the external object, and convert the reflected light pulse into an electrical signal.

The logic circuit 204 is configured to control the light source to emit the light pulse, and process the electrical signal converted by the photoelectric detector.

The optical component 202 may be included in the lens. The light source 201, the photoelectric detector 203, and the logic circuit 204 may be included in the UDC.

When the TOF camera operates, the logic circuit 204 controls the light source 201 to generate and emit the light pulse, and the light pulse is transmitted through the optical component 202 to a target 205. The light pulse reflected at the target 205 enters the photoelectric detector 203 through the optical component 202, for being converted into the electrical signal. The logic circuit 204 performs subsequent imaging processing based on the electrical signal converted by the photoelectric detector 203.

In a possible design, data lines connected to the pixel units in the display area may pass through the UDC area.

Figure 3:
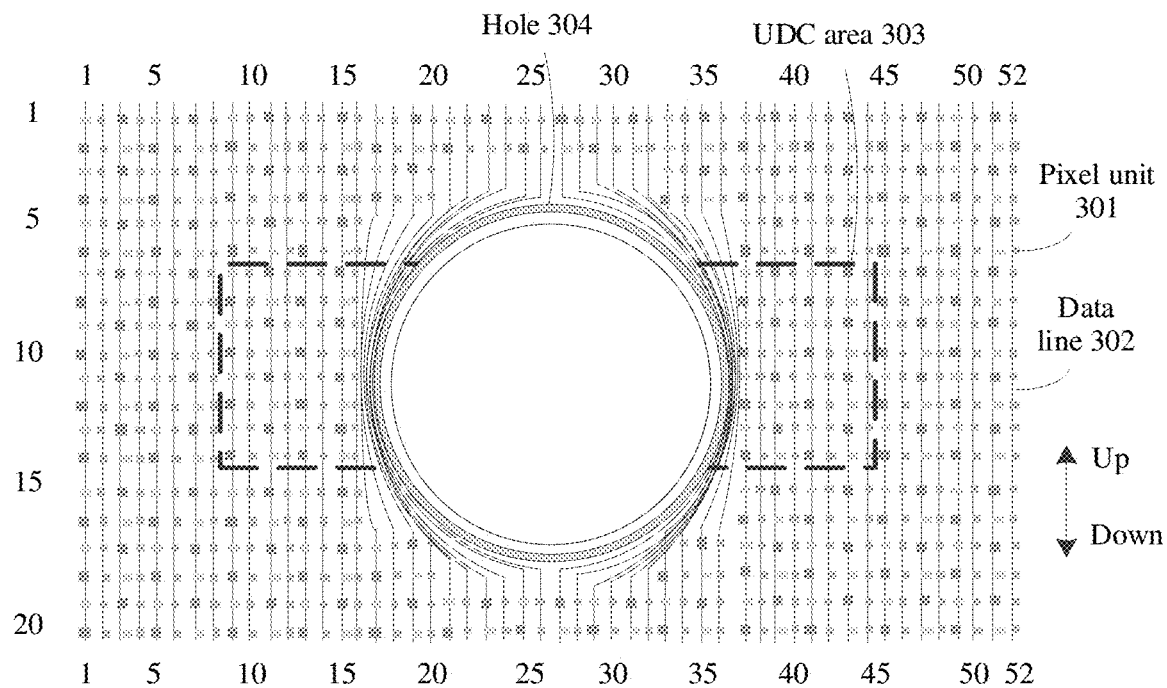
FIG. 3 is a schematic diagram of a structure of a camera area according to a possible implementation.

For example, FIG. 3 is a schematic diagram of a structure of a specific display circuit according to a possible implementation. FIG. 3 shows an example of 20 rows*52 columns of pixel units 301 and 52 data lines 302. Each column of pixel units 301 is connected by using the data line 302.

Some of the pixel units of the 9th column to the 16th column and some of the pixel units of the 37th column to the 44th column are located in a UDC area 303. Some of the pixel units 301 in the hole 304 and a surrounding area are missing, and therefore a quantity of pixel units 301 of the 17th column to 36th column is small.

As shown in FIG. 3, when the pixel units 301 of the 17th column to 36th column are connected by using the data lines 302, the data lines 302 extend around the edges of the hole 304 to pass through the UDC area 303. When the pixel units 301 of the 9th column to the 16th column and the pixel units 301 of the 37th column to the 44th column that correspond to the UDC area 303 are connected by using the data lines 302, the data lines 302 pass through the UDC area 303 and occupy space of the UDC area 303, to reduce transmittance of the UDC area 303, and reduce a shooting effect of the camera.

In this way, when a plurality of columns of pixel units 301 corresponding to the hole 304 are connected by using the data lines 302, the data lines 302 occupy space of the UDC area 303, to reduce transmittance of the UDC area 303, and reduce a shooting effect of the camera.

Figure 4:
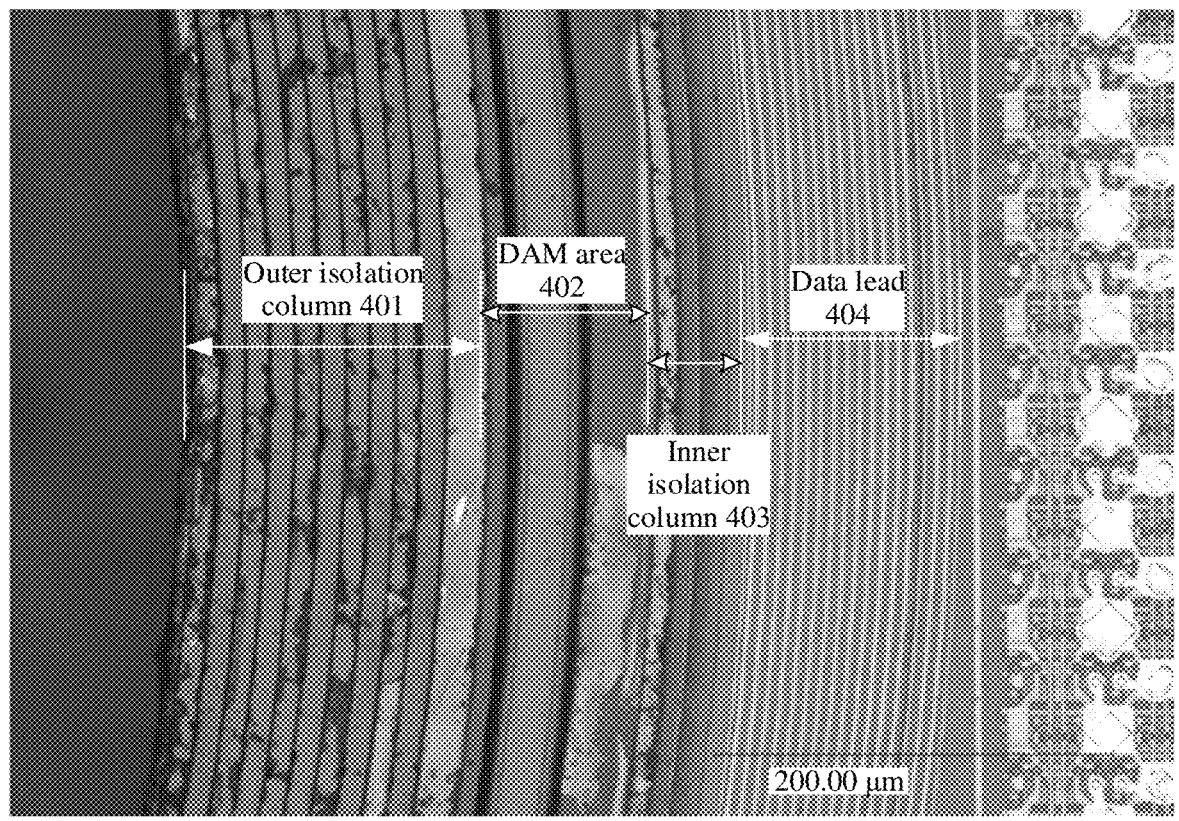
FIG. 4 is a schematic diagram of a structure of a camera area according to a possible implementation.

FIG. 4 is an analytical diagram of an optical lens of an area around a hole according to a possible implementation. As shown in FIG. 4, an outer isolation column 401, a DAM area 402, an inner isolation column 403, and a data line 404 are included near the hole. The data line 404 extends around the hole.

The outer isolation column 401, the DAM area 402, and the inner isolation column 403 are used to isolate water and air, to avoid performance degradation caused by water absorption of the organic material.

On this basis, in this embodiment of this application, an area of the bottom drive circuit in the pixel units is less than an area of the light emitting device in the pixel units, and therefore space of the data lines is reserved. The data lines are led out from the middle of the pixel units without passing through the UDC area, so that the data lines do not occupy space of the UDC area, to improve the transmittance.

The following describes a display circuit in embodiments of this application with reference to the accompanying drawings.

Figure 5:
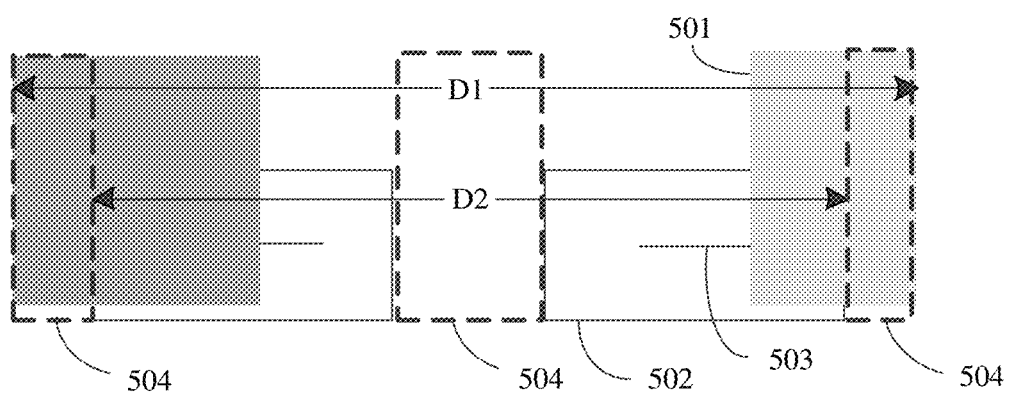
FIG. 5 is a schematic diagram of a structure of a pixel unit according to an embodiment of this application.

FIG. 5 is a schematic diagram of a structure of a pixel unit according to an embodiment of this application. As shown in FIG. 5, the pixel unit includes a light emitting device 501, a bottom drive circuit 502, and an anode lead 503.

The light emitting device 501 is connected to the bottom drive circuit 502 by using the anode lead 503.

The light emitting device 501 is configured to emit light. The light emitting device 501 may emit one or more of red light, green light, and blue light. This is not limit in this embodiment of this application. For example, each light emitting device 501 may alternatively emit light of other colors such as cyan, magenta, and yellow. Light emitted by a plurality of light emitting devices 501 constitutes a display image. The light emitting device 501 may be an organic light emitting diode. Sizes and shapes of the light-emitting devices 501 may be uniform, or may not be uniform. This is not limit in this embodiment of this application.

The bottom drive circuit 502 is configured to drive the light emitting device 501. The bottom drive circuit 502 may include a plurality of transistors, capacitors, and the like.

For example, the bottom drive circuit 502 may include a first transistor T1, a second transistor T2, and a capacitor Cst. The first transistor T1 and the second transistor T2 may be thin film transistors.

The second transistor T2 is a switching transistor, and may be connected to a scanning line and a data line. The second transistor T2 is configured to transmit, to the first transistor T1 based on a switching voltage input to the scanning line, a data signal input from the data line.

The capacitor Cst may be connected to the second transistor T2 and a supply voltage line. The capacitor Cst is configured to store a voltage corresponding to a difference between a voltage corresponding to the data signal received from the second transistor T2 and a first supply voltage ELVDD supplied to the supply voltage line. The supply voltage line may be spaced parallel to the scanning line or the data line.

The first transistor T1 is a drive transistor, and may be connected to the supply voltage line and the capacitor Cst. The first transistor T1 is configured to control, in response to a voltage value stored in the capacitor Cst, a drive current Ioled flowing through the light emitting device 501, to control light emitting intensity of the light emitting device 501, and the like. The bottom drive circuit 502 may alternatively be a 7T1C circuit or the like. A quantity of transistors and a quantity of capacitors may be variable based on a design of the bottom drive circuit. This is not limited in this embodiment of this application.

In this embodiment of this application, a dimension of an area enclosed by the bottom drive circuits is less than a dimension of an area enclosed by the pixel unit, and therefore there is a gap between the bottom drive circuits, and subsequently the data line passes through the gap. For example, a dimension of the light emitting device in a row direction is greater than a dimension of the bottom drive circuit corresponding to the adjacent light emitting devices in the row direction.

In FIG. 5, a dimension D2 of an area enclosed by the bottom drive circuits in the row direction is less than a dimension D1 of an area enclosed by the pixel unit in the row direction, and therefore there is a gap 504 between the bottom drive circuits.

When D1 is greater than D2, it may be understood that a width of the bottom drive circuit 502 is less than a width of the light emitting device 501 controlled by the bottom drive circuit. Alternatively, it may be understood that occupation space of the bottom drive circuit 502 of the pixel unit is less than occupation space of the light emitting device 501 controlled by the bottom drive circuit, or the plurality of light emitting devices 501 are divergent relative to corresponding bottom drive circuits 502. In this way, there is the gap 504 between adjacent bottom drive circuits 502, so that transmittance of a backplane is improved, or the gap is used to arrange the data line.

Figure 6:
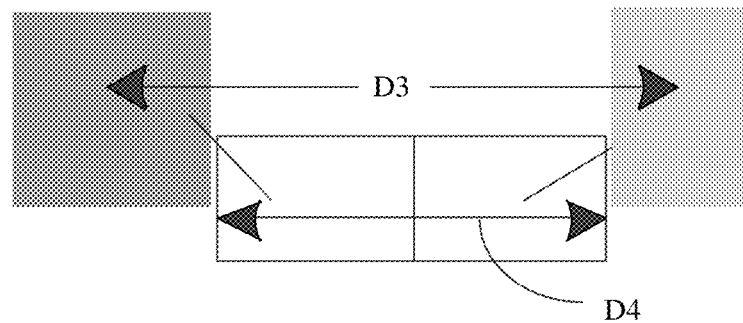
FIG. 6 is a schematic diagram of a structure of a pixel unit according to an embodiment of this application.

In a possible implementation, to increase a width of the gap, and facilitate arrangement of the data line, an interval between geometric centers of adjacent light emitting devices in the row direction is greater than a dimension between corresponding bottom drive circuits in the row direction. As shown in FIG. 6, D3 is the dimension between geometric centers of adjacent light emitting devices in the row direction, and D4 is the dimension between the adjacent bottom drive circuits in the row direction. D3 is greater than D4. In a possible implementation, one pixel unit includes a plurality of light emitting devices. The bottom drive circuits of the plurality of light emitting devices may be arranged or integrated together, and therefore an area ratio of the plurality of bottom drive circuits to the plurality of light emitting devices in the pixel unit is less than 1.

Figure 7:
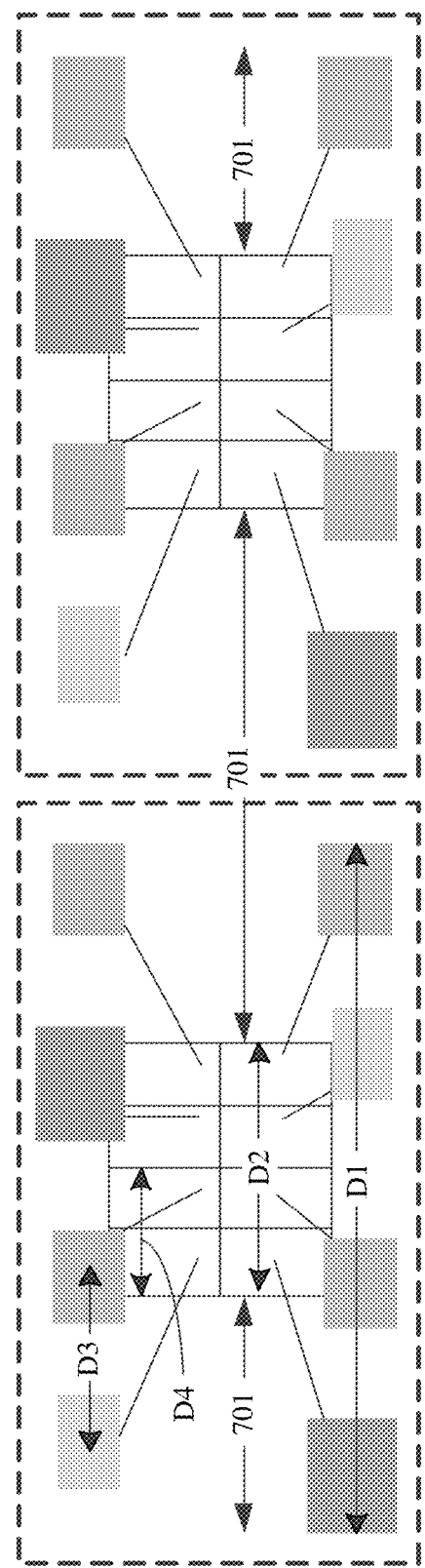
FIG. 7 is a schematic diagram of a structure of a pixel unit according to an embodiment of this application.

For example, the light emitting devices in the display circuit are periodically arranged in a matrix shape. As shown in FIG. 7, one pixel unit may include two rows*four columns of light emitting devices. The first row of light emitting devices separately emit red light, green light, blue light, and green light, and the second row of light emitting devices separately emit blue light, green light, red light, and green light. A color of light emitted by the light emitting devices in the pixel unit and an arrangement sequence of the light emitting devices are not limited in this embodiment of this application.

In FIG. 7, a dimension D2 of an area enclosed by bottom drive circuits is less than a dimension D1 of an area enclosed by the pixel unit, and the bottom drive circuits of the eight light emitting devices in the pixel unit are arranged together. In this case, an area ratio of the bottom drive circuits to the light emitting devices in the pixel unit is less than 1. Occupation areas of the bottom drive circuits of the plurality of light emitting devices are reduced, and a gap 701 between the bottom drive circuits of adjacent pixel units is increased, to facilitate arrangement of the data line, or further improve transmittance of the backplane.

In FIG. 7, a dimension D3 between geometric centers of adjacent light emitting devices in the row direction is greater than a dimension D4 between adjacent bottom drive circuits in the row direction. This is not limited in this embodiment of this application.

It may be understood that one pixel unit may alternatively include another quantity of light emitting devices. A quantity of the light emitting device and arrangement of the bottom drive circuit in the pixel unit are not limited in this embodiment of this application. A pixel unit may be square or rectangular. This is not limited herein.

In a possible implementation, the light emitting device may have various shapes, and the same row of the light emitting devices may not be located on a same straight line. A shape of the light emitting device and arrangement of the light emitting device are not limited in this embodiment of this application.

Figure 8:
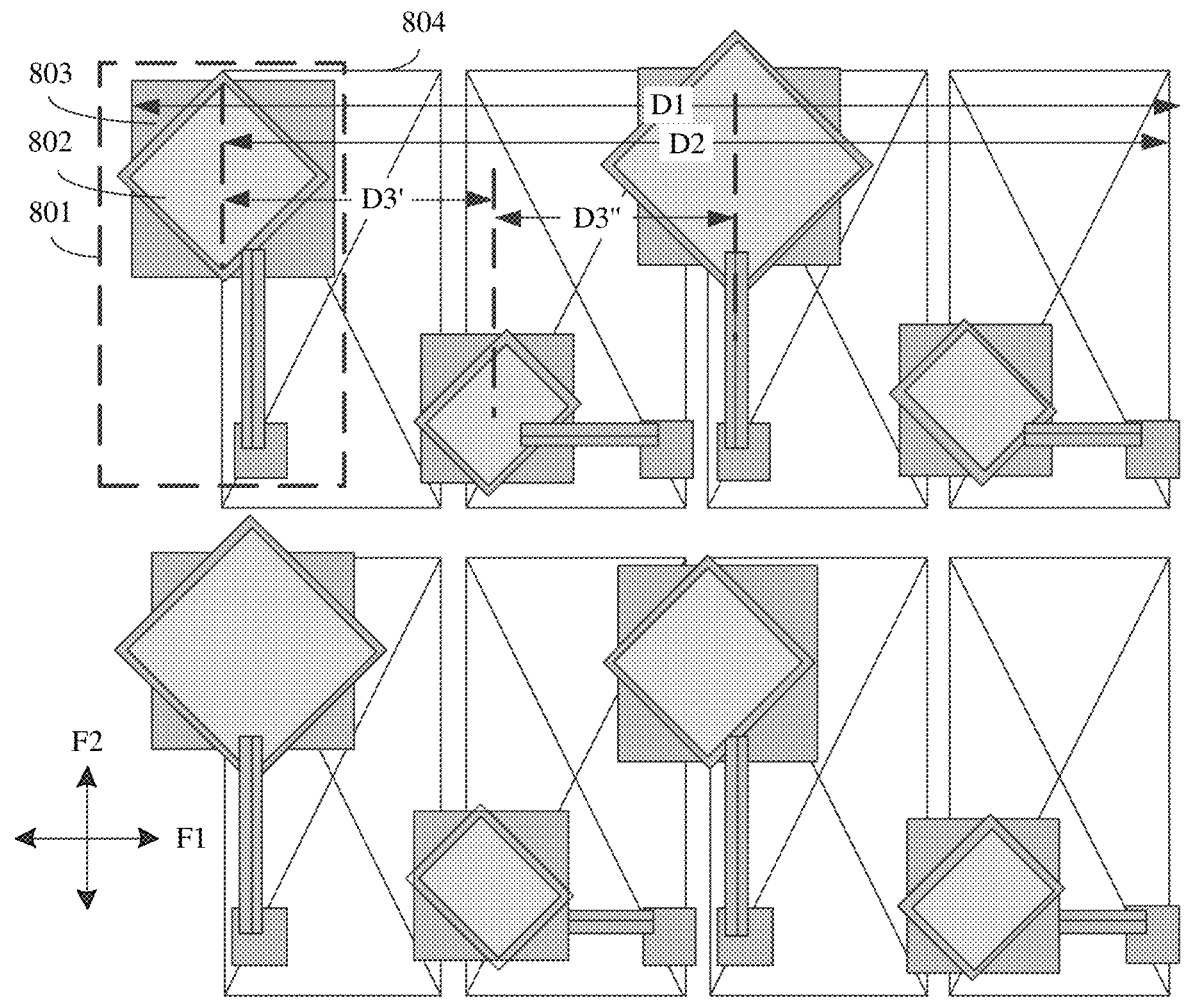
FIG. 8 is a schematic diagram of a structure of a pixel unit according to an embodiment of this application.

For example, as shown in FIG. 8, a pixel unit includes a plurality of light emitting devices 801 and a plurality of bottom drive circuits 804. The light emitting device 801 includes a light emitting area 802 and a process redundancy area 803. The light emitting area 802 is diamond-shaped.

In FIG. 8, a dimension D2 of an area enclosed by the bottom drive circuits in the row direction is less than a dimension D1 of an area enclosed by the pixel unit in the row direction, and therefore there is a gap between the bottom drive circuits. When D1 is greater than D2, there is a gap between the bottom drive circuits 802 corresponding to the first column of light emitting devices 801 and the second column of light emitting devices 801 in the pixel unit, so that transmittance of a backplane is improved, or the gap is used to arrange the data line.

In a possible implementation, intervals D3 between adjacent light emitting devices in the pixel unit may be equal or may not be equal. For example, in FIG. 8, an interval D3' between a geometric center of the first light emitting area 802 and a geometric center of the second light emitting area 802 in the first direction F1 is not equal to an interval D3" between the geometric center of the second light emitting area 802 and a geometric center of the third light emitting area 802 in the first direction F1.

Arrangement of the light emitting devices in the pixel unit shown in FIG. 7 and FIG. 8 is one of RGB (for example, SPR-RGB) including an algorithm. Alternatively, an arrangement manner of the light emitting devices includes a real-RGB (real-RGB) manner. The arrangement manner of the light emitting devices is not limited in this embodiment of this application.

The following describes a layout of data lines with reference to FIG. 9 to FIG. 12. It should be noted that all the pixel units have a relatively large quantity of data lines, and FIG. 9 to FIG. 12 show data lines of some of the pixel units.

Figure 9:
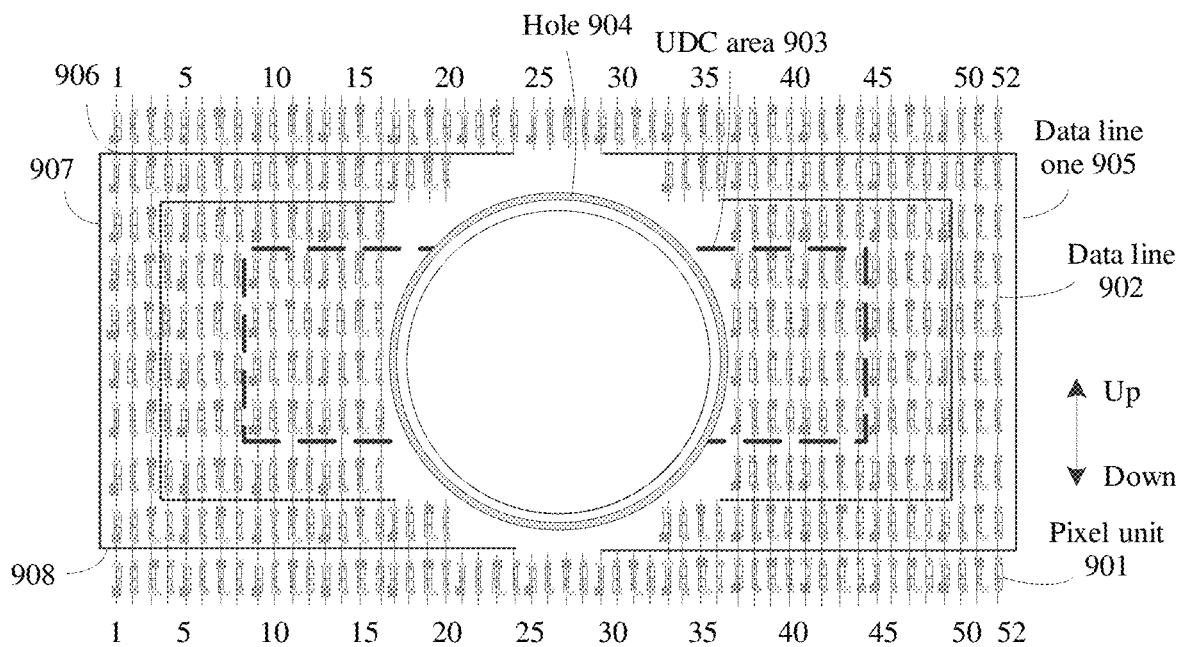
FIG. 9 is a schematic diagram of a structure of a display circuit according to an embodiment of this application.

FIG. 9 is a schematic diagram of a structure of a specific display circuit according to an embodiment of this application. As shown in FIG. 9, the display circuit includes pixel units 901, data lines 902, a UDC area 903, a hole 904, and a first data line 905.

For functions and structures of the pixel units 901, the data lines 902, the UDC area 903, and the hole 904, refer to the descriptions of FIG. 1 and FIG. 3. Details are not described herein.

The data line one 905 includes a first part connection line 906, a second part connection line 907, and a third part connection line 908. The first part connection line 906, the second part connection line 907, and the third part connection line 908 communicate with each other. The first part connection line 906 is located on an upper side of the center of the hole 904, and the third part connection line 908 is located on a lower side of the center of the hole 904.

The first part connection line 906 extends in a row direction and passes through gaps between the pixel units 901 to connect the second part connection line 907; the second part connection line 907 extends in a column direction and passes through gaps between the pixel units 901 to connect the third part connection line 908; and the third part connection line 908 extends in the row direction and passes through gaps between the pixel units 901.

The first part connection line 906, the second part connection line 907 and the third part connection line 908 are connected at right angles.

FIG. 9 shows an example of 20 rows*52 columns of pixel units 901 and a plurality of data lines 902. Some of the pixel units 901 of the 9th column to the 16th column and some of the pixel units 901 of the 37th column to the 44th column are located in the UDC area 903. Some of the pixel units 901 in the hole 904 and a surrounding area of the hole 904 are missing, and therefore a quantity of pixel units 901 of the 17th column to the 36th column is small.

As shown in FIG. 9, pixel units 901 of the 1st column to the 16th column and pixel units 901 of the 37th column to the 52nd column are connected by using the data lines 902. The pixel units 901 of the 17th column to the 36th column are connected by using the data lines 902 and a data line one 905.

In this way, when the pixel units of the 17th column to the 36th column corresponding to the hole 904 are connected, the data lines 902 do not pass through the UDC area 903 and do not occupy space of the UDC area 903, so that transmittance of the UDC area 903 is improved, and a shooting effect of the camera is improved.

In this embodiment of this application, all the first part connection line, the second part connection line, and the third part connection line are parts of the data lines and pass through gaps between pixel units. In this way, when the pixel units corresponding to the hole are connected, the data lines do not pass through the UDC area and do not occupy space of the UDC area, so that transmittance of the UDC area is improved, and a shooting effect of the camera is improved.

In a possible implementation, the UDC area may include no bottom drive circuit in the pixel unit. In this way, transmittance of the UDC area may be further improved, and a shooting effect of the camera is improved.

Figure 10:
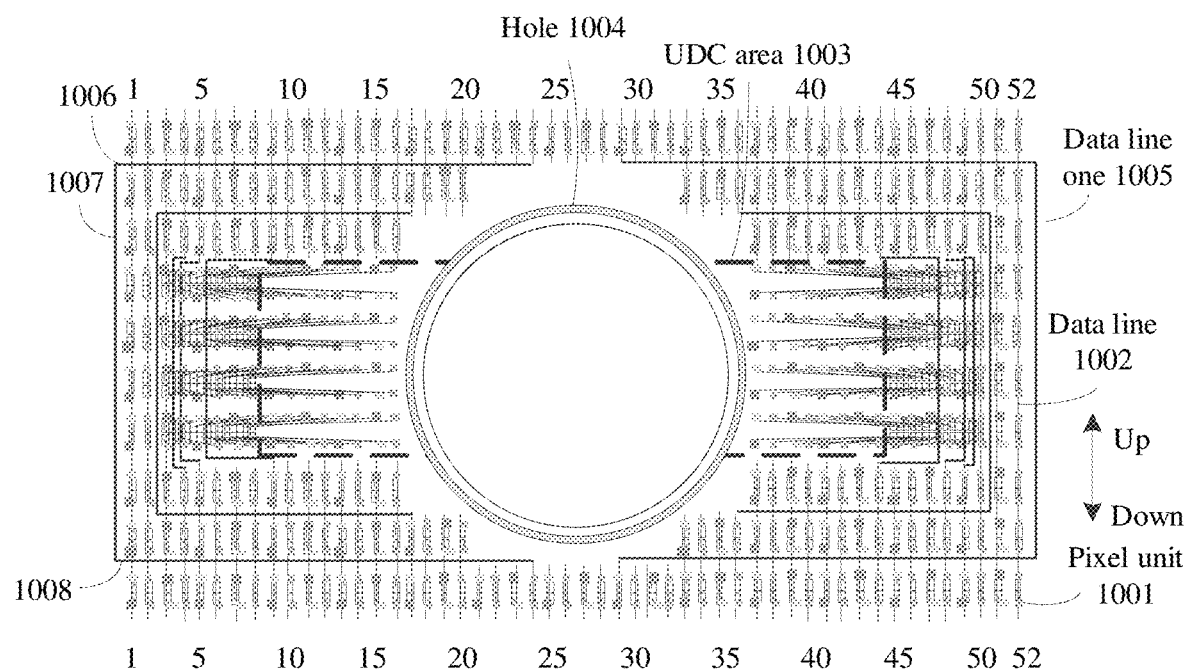
FIG. 10 is a schematic diagram of a structure of a display circuit according to an embodiment of this application.

For example, FIG. 10 is a schematic diagram of a structure of a display circuit according to an embodiment of this application. As shown in FIG. 10, the display circuit includes pixel units 1001, data lines 1002, a UDC area 1003, a hole 1004, and a data line one 1005.

For functions and structures of the pixel units 1001, the data lines 1002, the UDC area 1003, and the hole 1004, refer to the descriptions of FIG. 1 and FIG. 3. Details are not described herein.

The data line one 1005 includes a first part connection line 1006, a second part connection line 1007, and a third part connection line 1008. The first part connection line 1006, the second part connection line 1007, and the third part connection line 1008 communicate with each other. The first part connection line 1006 is located on an upper side of the center of the hole 1004, and the third part connection line 1008 is located on a lower side of the center of the hole 1004.

The first part connection line 1006 extends in a row direction and passes through gaps between the pixel units 1001 to connect the second part connection line 1007; the second part connection line 1007 extends in a column direction and passes through gaps between the pixel units 1001 to connect the third part connection line 1008; and the third part connection line 1008 extends in the row direction and passes through gaps between the pixel units 1001. FIG. 10 shows an example of 52 columns of pixel units 1001 and a plurality of data lines 1002. Some of the pixel units 1001 of the 9th column to the 16th column and some of the pixel units of the 37th column to the 44th column are located in the UDC area 1003. Some of the pixel units 1001 in the hole 1004 and a surrounding area of the hole 1004 are missing, and therefore a quantity of pixel units 1001 of the 17th column to the 36th column is small.

As shown in FIG. 10, pixel units 1001 of the 1st column to the 3rd column and pixel units 1001 of the 50th column to the 52nd column are connected by using the data lines 1002. Pixel units 1001 of the 4th column to the 49th column are connected by using the data lines 1002 and the data line one 1005. The data line one 1005 passes through gaps between the pixel units 1001.

Compared with FIG. 9, in the display circuit shown in FIG. 10, bottom drive circuits corresponding to the UDC area move in the row direction. Bottom drive circuits corresponding to some of the pixel units of the 4th column to the 16th column are arranged closely, and bottom drive circuits corresponding to some of the pixel units of the 37th column to the 49th column are arranged closely. In this way, the UDC area includes no bottom drive circuit, so that transmittance of the UDC area is further improved, and a shooting effect of the camera is improved.

In a possible implementation, the bottom drive circuits corresponding to the UDC area may move in the column direction. The bottom drive circuits corresponding to the UDC area may not be in the display area and may move to the peripheral area (for example, a border frame area). Positions of the bottom drive circuits corresponding to the UDC area are not limited in this embodiment of this application.

Figure 11:
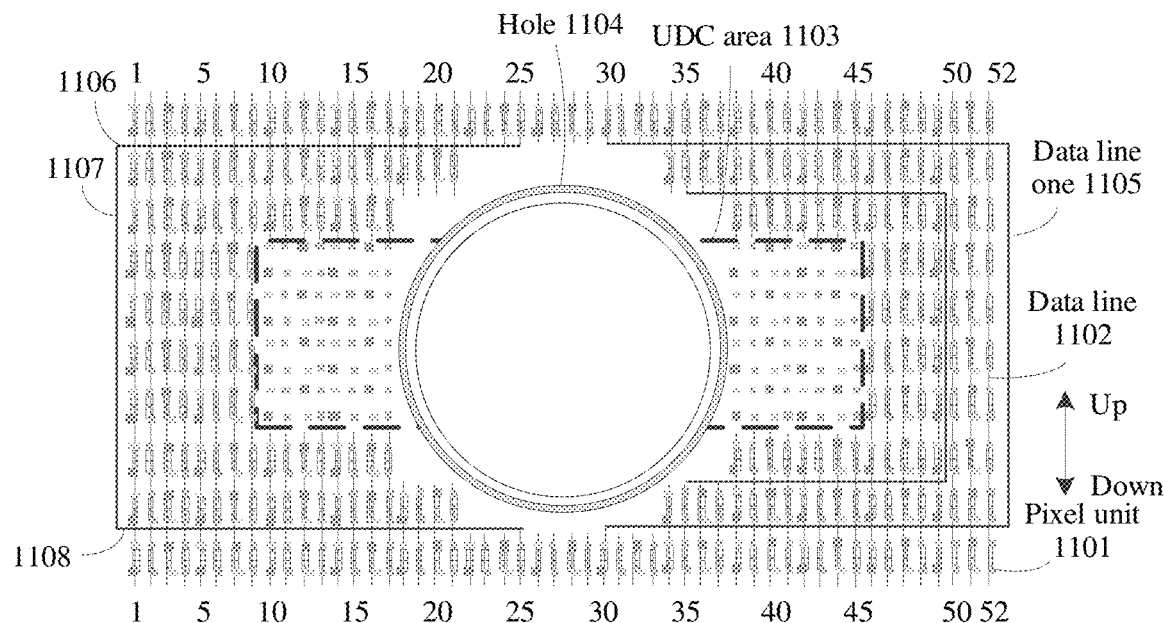
FIG. 11 is a schematic diagram of a structure of a display circuit according to an embodiment of this application.

FIG. 11 is a schematic diagram of a structure of a display circuit according to an embodiment of this application. As shown in FIG. 11, the display circuit includes pixel units 1101, data lines 1102, a UDC area 1103, a hole 1104, and a data line one 1105.

For functions and structures of the pixel units 1101, the data lines 1102, the UDC area 1103, and the hole 1104, refer to the descriptions of FIG. 1 and FIG. 3. Details are not described herein.

The data line one 1105 includes a first part connection line 1106, a second part connection line 1107, and a third part connection line 1108. The first part connection line 1106, the second part connection line 1107, and the third part connection line 1108 communicate with each other. The first part connection line 1106 is located on an upper side of the center of the hole 1104, and the third part connection line 1108 is located on a lower side of the center of the hole 1104.

The first part connection line 1106 extends in a row direction and passes through gaps between the pixel units 1101 to connect the second part connection line 1107; the second part connection line 1107 extends in a column direction and passes through gaps between the pixel units 1101 to connect the third part connection line 1108; and the third part connection line 1108 extends in the row direction and passes through gaps between the pixel units 1101.

FIG. 11 shows an example of 20 rows*52 columns of pixel units 1101 and a plurality of data lines 1102. Some of the pixel units 1101 of the 9th column to the 16th column and some of the pixel units 1101 of the 37th column to the 44th column are located in the UDC area 1103. Some of the pixel units 1101 in the hole 1104 and a surrounding area of the hole 1104 are missing, and therefore a quantity of pixel units 1101 of the 17th column to the 36th column is small.

As shown in FIG. 11, pixel units 1101 of the 1st column to the 8th column and pixel units 1101 of the 45th column to the 52nd column are connected by using the data lines 1102. The pixel units 1101 of the 9th column to the 44th column are connected by using the data lines 1102 and the data line one 1105. The data line one 1105 passes through gaps between the pixel units 1101.

It should be noted that bottom drive circuits in the pixel units corresponding to the UDC area 1103 move to another position (for example, a border frame area). Light emitting devices corresponding to the UDC area 1103 in FIG. 11 may be connected to corresponding bottom drive circuits by using anode leads. The anode leads in the UDC area 1103 are made of transparent materials. For the bottom drive circuits corresponding to the UDC area 1103, details are not described herein.

Compared with FIG. 8, in this embodiment of this application, the bottom drive circuits in the pixel units corresponding to the UDC area move to another position, and the anode leads are made of transparent materials. In this way, transmittance of the UDC area is further improved, and a shooting effect of the camera is improved.

In a possible implementation, the display panel individually controls data signals of the pixel units in the UDC area. A plurality of columns of pixel units corresponding to the UDC area may also be connected by using the first data line. Details are not described herein.

In the foregoing embodiments, the first part connection line, the second part connection line and the third part connection line extend linearly and are connected at right angles, and the first part connection line, the second part connection line and the third part connection line may alternatively extend in a curved shape and/or are connected at rounded angles. The first part connection line, the second part connection line, and the third part connection line may be arranged between pixel units in Z shapes, Ω shapes, or zigzag shapes. Specific arrangement shapes of the first part connection line, the second part connection line and the third part connection line are not limited in this embodiment of this application.

Figure 12:
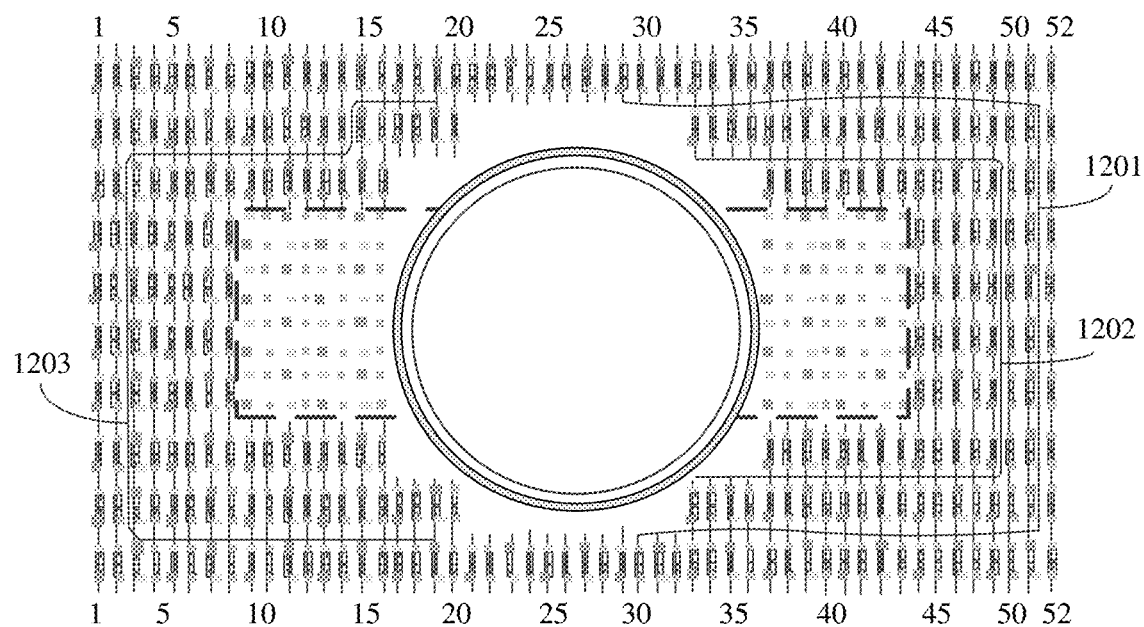
FIG. 12 is a schematic diagram of a structure of a display circuit according to an embodiment of this application.

For example, as shown in FIG. 12, the first part connection line, the second part connection line, and the third part connection line may be wired in manners of extending in a curved shape 1201, a rounded angle connection 1202, and a step-included shape 1203.

On the basis of the foregoing embodiments, the bottom drive circuits corresponding to the light emitting devices in the pixel units may be arranged together, so that occupation space is further reduced. A space distance between adjacent pixel units is large, to accommodate arrangement of more data lines. A quantity of the light emitting device in the pixel unit is not limited in this embodiment of this application.

Figure 13:
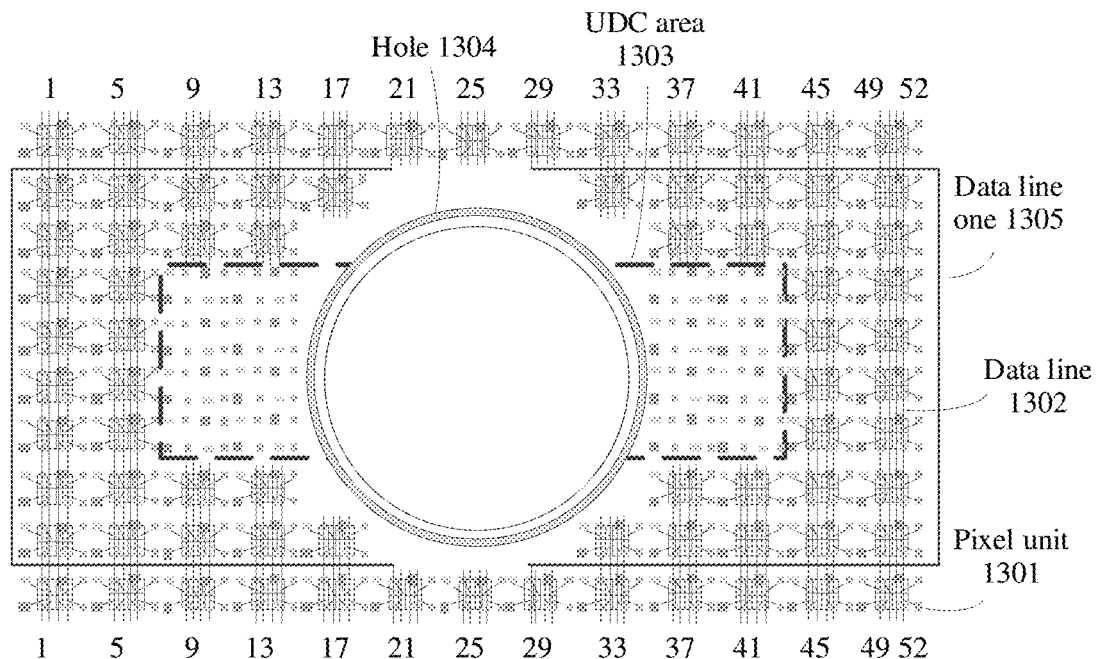
FIG. 13 is a schematic diagram of a structure of a display circuit according to an embodiment of this application.

For example, the pixel unit includes two rows*four columns of light emitting devices. As shown in FIG. 13, the display circuit includes pixel units 1301, data lines 1302, a UDC area 1303, a hole 1304, and a first data line 1305.

For functions and structures of the pixel units 1301, the data lines 1302, the UDC area 1303, the hole 1304, and the data line one 1305, refer to the descriptions of corresponding components above. Details are not described herein.

FIG. 13 shows an example of 13 columns of pixel units 1301 and a plurality of data lines 1302. Some of the light emitting devices of the 9th column to the 16th column and some of the light emitting devices of the 37th column to the 44th column are located in the UDC area 1303. Light emitting devices in some of the pixel units 1301 in the hole 1304 and a surrounding area of the hole 1304 are missing, and therefore a quantity of light emitting devices of the 17th column to the 36th column is small.

As shown in FIG. 13, light emitting devices of the 1st column to the 8th column and light emitting devices of the 45th column to the 52nd column are connected by using the data lines 1302. The light emitting devices of the 9th column to the 44th column are connected by using the data lines 1302 and the data line one 1305. The data line one 1305 passes through gaps between the pixel units.

Compared with FIG. 10, in this embodiment of this application, one pixel unit includes two rows*four columns of light emitting devices, and bottom drive circuits corresponding to the light emitting devices in the one pixel unit are arranged together, so that occupation space is further reduced, and transmittance of the UDC area is improved.

Figure 14:
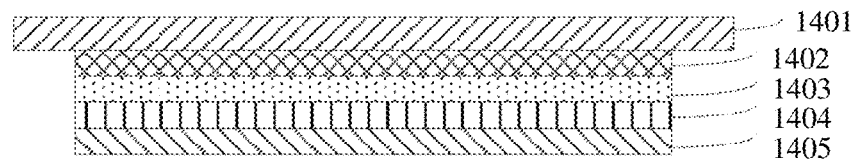
FIG. 14 is a schematic diagram of a structure of a display according to an embodiment of this application.

An embodiment of this application further provides a display. The display includes the foregoing display panel, and the display panel is configured to display an image. For example, as shown in FIG. 14, the display includes, but is not limited to, a protection cover plate 1401, a polarizer 1402, a display panel 1403, a heat dissipation layer 1404, and a protection layer 1405.

The polarizer 1402 is fixed to the protection cover plate 1401. The protection cover plate 1401 may be a transparent glass cover plate or an organic material cover plate such as polyimide, to reduce impact on a display effect of the display while providing protection. The polarizer 1402 may be a circular polarizer, and is configured to avoid anode reflection of light. The heat dissipation layer 1404 may be a heat dissipation copper foil, and the protection layer 1405 may be a protection foam. The layer structures of the display may be bonded by using an optical transparent adhesive or a non-transparent pressure sensitive adhesive. In addition, because ingredients such as water vapor and oxygen in the air have great impact on a service life of a light emitting device of the display panel 1403, water-and-oxygen encapsulation needs to be strictly performed on the light emitting device of the display panel, to sufficiently separate functional layers of the light emitting device from the ingredients such as water vapor and oxygen in the air.

In this embodiment of this application, the display may be a flexible display or a rigid display. For example, the display may be an OLED display, a QLED flexible display, a curled screen, a foldable screen, or the like.

Figure 15:
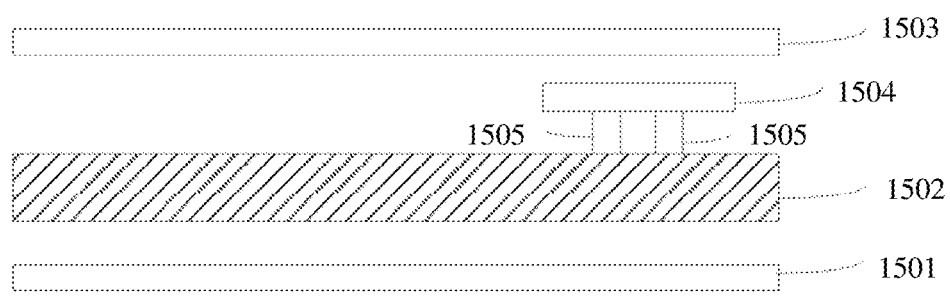
FIG. 15 is a schematic diagram of a structure of a display device according to an embodiment of this application.

An embodiment of this application further provides a display device. The display device includes the foregoing display, and the display is configured to display an image. For example, as shown in FIG. 15, the display device includes, but is not limited to, a display 1501, a middle frame 1502, a rear housing 1503, and a printed circuit board (printed circuit board, PCB) 1504. The middle frame 1502 may be configured to bear the printed circuit board and the display 1501. The display 1501 and the printed circuit board are located on two sides of the middle frame 1502, and the rear housing 1503 is located on one side of the printed circuit board away from the middle frame 1502. In addition, the display device may further include a component 1505 disposed on the PCB 104, where the component 1505 may be, but is not limited to be, disposed on one side of the PCB 1504 toward the middle frame 1502.

In this embodiment of this application, the display device may be a terminal device having a display. For example, the terminal device includes: a mobile phone (mobile phone), a tablet computer, a notebook computer, a palmtop computer, a mobile internet device (mobile internet device, MID), a wearable device, a virtual reality (virtual reality, VR) device, an augmented reality (augmented reality, AR) device, a wireless terminal in industrial control (industrial control), a wireless terminal in self driving (self driving), a wireless terminal in remote medical surgery (remote medical surgery), a wireless terminal in smart grid (smart grid), a wireless terminal in transportation safety (transportation safety), a wireless terminal in smart city (smart city), a wireless terminal in smart home (smart home), a cellular phone, a cordless phone, a session initiation protocol (session initiation protocol, SIP) phone, a wireless local loop (wireless local loop, WLL) station, a personal digital assistant (personal digital assistant, PDA), a handheld device having a wireless communication function, a computing device or another processing device connected to a wireless modem, a vehicle-mounted device, a wearable device, a terminal device in a 5G network, a terminal device in a future evolved public land mobile network (public land mobile network, PLMN), or the like. This is not limited in this embodiment of this application.

In addition, in this embodiment of this application, the terminal device may also be a terminal device in an internet of things (internet of things, IoT) system. IoT is an important part in development of information technologies in the future, and a main technical feature of the IoT is to connect things to a network by using a communication technology, to achieve an intelligent network with man-machine interconnection and interconnection of things.

The terminal device in this embodiment of this application may also be referred to as user equipment (user equipment, UE), a mobile station (mobile station, MS), a mobile terminal (mobile terminal, MT), an access terminal, a subscriber unit, a subscriber station, a mobile radio station, a mobile station, a remote station, a remote terminal, a mobile device, a user terminal, a terminal, a wireless communication device, a user agent, a user apparatus, or the like.

In embodiments of this application, the terminal device or each network device includes a hardware layer, an operating system layer that runs at the hardware layer, and an application layer that runs at the operating system layer. The hardware layer may include hardware such as a central processing unit (central processing unit, CPU), a memory management unit (memory management unit, MMU), and a memory (also referred to as a main memory). The operating system may be any one or more computer operating systems for implementing service processing through a process (process), for example, a Linux operating system, a Unix operating system, an Android operating system, an iOS operating system, or a Windows operating system. The application layer includes applications such as a browser, an address book, word processing software, and instant messaging software.

The foregoing descriptions are merely specific embodiments of this application, but the protection scope of embodiments of this application is not limited thereto. Any variation or replacement within the technical scope disclosed in embodiments of this application shall fall within the protection scope of embodiments of this application. Therefore, the protection scope the embodiments of this application shall be subject to the protection scope of the claims.

What is claimed is:

1. A display panel, comprising:
    a display area and a peripheral area at least partially surrounding the display area, wherein the display area comprises a second area and a first area that is disposed around a hole; and the first area comprises a plurality of first pixel units arranged in columns;
    the second area comprises a plurality of second pixel units and K data lines arranged between the second pixel units in the second area, wherein K is a natural number, and the plurality of first pixel units in the first area are connected in a column direction to corresponding columns of second pixel units in the second area;
    some or all of the second pixel units comprise M columns*N rows of light emitting devices, M columns*N rows of bottom drive circuit, and M*N anode leads, wherein the anode leads are used to connect the light emitting devices to the bottom drive circuits, the bottom drive circuits are disposed at lower layers of the light emitting devices, and both M and N are natural numbers, wherein
    intervals between the adjacent light emitting devices in a row direction in the some or all of the second pixel units are greater than dimensions between the bottom drive circuits corresponding to the adjacent light emitting devices in the row direction, and therefore there are gaps between the some or all of the second pixel units; and
    the K data lines are used to pass through gaps between the plurality of second pixel units in the second area, to connect Q columns of second pixel units in the second area, wherein the Q columns of second pixel units comprise a plurality of columns of second pixel units whose holes correspond to the second area in the column direction, and Q is a natural number less than or equal to K.

2. The display panel according to claim 1, wherein the hole is configured to dispose a lens of a camera, the first area is used to dispose a sensor of the camera, and the first area is a UDC area.

3. The display panel according to claim 1, wherein the light emitting device comprises a light emitting area and a process redundancy area, and the interval is a distance between geometric centers of light emitting areas in the adjacent light emitting devices in the row direction.

4. The display panel according to claim 1, wherein any one of the data lines comprises a first part connection line, a second part connection line, and a third part connection line, and the first part connection line, the second part connection line, and the third part connection line communicate with each other; and connection points formed between the first part connection line and any column of the light emitting devices are located on a first side of the hole, and connection points formed between the third part connection line and any column of the light emitting devices are located on a second side of the hole, wherein the first side is opposite to the second side;
  the first part connection line extends in the row direction and passes through gaps between the second pixel units in the second area to connect the second part connection line;
  the second part connection line extends in the column direction and passes through gaps between the second pixel units in the second area to connect the third part connection line; and
  the third part connection line extends in the row direction and passes through gaps between the second pixel units in the second area.

5. The display panel according to claim 4, wherein a straight line in which the first part connection line is located and a straight line in which the second part connection line is located are connected at an included angle of 90 degrees, and the straight line in which the second part connection line is located and a straight line in which the third part connection line is located are connected at an included angle of 90 degrees.

6. The display panel according to claim 1, wherein N is a multiple of 2, and K is equal to Q*M; and
  the Q columns of second pixel units are connected by using the K data lines; and the second pixel units of the L columns to the Q column other than the Q columns of second pixel units in the L columns of second pixel units extend and are connected in the column direction.

7. The display panel according to claim 1, wherein any one of the data lines passes through the gaps between the plurality of second pixel units in the second area in a Z shape, a Ω shape, a zigzag shape, or a curved shape.

8. The display panel according to claim 1, wherein bottom drive circuits of the first pixel units in the first area are disposed in the peripheral area, light emitting devices of the first pixel units in the first area are disposed in the first area, and the light emitting devices of the first pixel units and the bottom drive circuits of the first pixel units are connected by using anode leads of transparent materials.

9. The display panel according to claim 8, wherein the Q columns of second pixel units further comprises a plurality of columns of second pixel units that are in the first area and that correspond to the second area in a column direction.

10. The display panel according to claim 1, wherein bottom drive circuits of the first pixel units in the first area are disposed in some of the second pixel units in the first area, light emitting devices of the first pixel units in the first area are disposed in the first area, and the light emitting devices of the first pixel units and the bottom drive circuits of the first pixel units are connected by using anode leads of transparent materials.

11. The display panel according to claim 1, wherein a width of the peripheral area is narrowed at a corner corresponding to the display area.

12. A display, comprising the display panel according to claim 1, wherein the display panel is configured to display an image.

13. A display panel, comprising:
  a display area and a peripheral area at least partially surrounding the display area, wherein the display area comprises a second area and a first area that is disposed around a hole;
  the first area comprises a plurality of first pixel units arranged in columns;
  the second area comprises a plurality of second pixel units and K data lines arranged between the second pixel units in the second area, wherein K is a natural number, and the plurality of first pixel units in the first area are connected in a column direction to corresponding columns of second pixel units in the second area;
  some or all of the second pixel units comprise M columns*N rows of light emitting devices, M columns*N rows of bottom drive circuit, and M*N anode leads, wherein the anode leads are used to connect the light emitting devices to the bottom drive circuits, the bottom drive circuits are disposed at lower layers of the light emitting devices, and both M and N are natural numbers, wherein
  a dimension of an area enclosed by the light emitting devices in the some or all of the second pixel units is greater than a dimension of an area enclosed by the bottom drive circuits corresponding to the light emitting devices in the second pixel units, and therefore there are gaps between the some or all of the second pixel units; and
  the K data lines are used to pass through gaps between the plurality of second pixel units in the second area, to connect Q columns of second pixel units in the second area, wherein the Q columns of second pixel units are a plurality of columns of second pixel units whose holes correspond to the second area in the column direction, and Q is a natural number less than or equal to K.

* * * * *

UNITED STATES PATENT AND TRADEMARK OFFICE
CERTIFICATE OF CORRECTION

| | |
|---|---|
| PATENT NO. | : 12,004,409 B2 |
| APPLICATION NO. | : 18/256265 |
| DATED | : June 4, 2024 |
| INVENTOR(S) | : Zheng Tian |

It is certified that error appears in the above-identified patent and that said Letters Patent is hereby corrected as shown below:

On the Title Page

Change "(71) Applicant: HONOR DEVICE CO., LTD., Guangdong (CN)", to "(71) Applicant: HONOR DEVICE CO., LTD., Shenzhen (CN)".

Signed and Sealed this
Sixth Day of August, 2024

Katherine Kelly Vidal
*Director of the United States Patent and Trademark Office*